(12) United States Patent
Lee et al.

(10) Patent No.: US 11,626,381 B2
(45) Date of Patent: Apr. 11, 2023

(54) BONDING HEAD INCLUDING A THERMAL COMPENSATOR, DIE BONDING APPARATUS INCLUDING THE SAME AND METHOD OF MANUFACTURING SEMICONDUCTOR PACKAGE USING THE SAME

(71) Applicant: SAMSUNG ELECTRONICS CO., LTD., Suwon-si (KR)

(72) Inventors: Jonggu Lee, Hwaseong-si (KR); Sunghyup Kim, Hwaseong-si (KR); Byungjo Kim, Seoul (KR); Sanghoon Lee, Seoul (KR); Sukwon Lee, Yongin-si (KR); Sebin Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 388 days.

(21) Appl. No.: 16/837,025

(22) Filed: Apr. 1, 2020

(65) Prior Publication Data
US 2021/0098415 A1  Apr. 1, 2021

(30) Foreign Application Priority Data
Sep. 27, 2019 (KR) .................. 10-2019-0120063

(51) Int. Cl.
*H01L 23/00* (2006.01)
*B29C 65/30* (2006.01)
*B29C 65/00* (2006.01)

(52) U.S. Cl.
CPC .............. *H01L 24/75* (2013.01); *B29C 65/30* (2013.01); *B29C 66/8185* (2013.01);
(Continued)

(58) Field of Classification Search
CPC ........... H01L 24/75; H01L 2224/75252; H01L 2224/75502; H01L 2224/75745; H01L 2224/75984; B29C 65/30; B29C 66/8185
(Continued)

(56) References Cited

U.S. PATENT DOCUMENTS 6,940,053 B2  9/2005  Shi
7,176,422 B2  2/2007  Shi
(Continued)

FOREIGN PATENT DOCUMENTS

JP        6405999 B2     10/2018
KR     10-1458710 B1     10/2014

*Primary Examiner* — Nduka E Ojeh
*Assistant Examiner* — Eric W Jones
(74) *Attorney, Agent, or Firm* — Lee IP Law, P.C.

(57) ABSTRACT

A bonding head for a die bonding apparatus and a die bonding apparatus including the bonding head, the bonding head including a head body; a thermal pressurizer mounted on a lower surface of the head body, the thermal pressurizer being configured to hold and heat at least one die and including a heater having a first heating surface that faces a held surface of the die; and a thermal compensator at an outer region of the die, the thermal compensator extending downwardly from the lower surface of the head body and including at least one thermal compensating block having a second heating surface that emits heat from a heating source therein and that faces a side surface of the die held on the thermal pressurizer.

20 Claims, 13 Drawing Sheets

(52) U.S. Cl.
CPC .............. *H01L 2224/75252* (2013.01); *H01L 2224/75502* (2013.01); *H01L 2224/75745* (2013.01); *H01L 2224/75984* (2013.01)

(58) Field of Classification Search
USPC ...................................................... 156/183.1
See application file for complete search history.

(56) References Cited

U.S. PATENT DOCUMENTS

| | | | |
|---|---|---|---|
| 7,736,950 B2 | 6/2010 | Pendse et al. | |
| 8,925,608 B2 | 1/2015 | Mayr | |
| 8,967,452 B2 | 3/2015 | Cheung et al. | |
| 9,105,629 B2 | 8/2015 | Interrante et al. | |
| 2002/0092887 A1* | 7/2002 | Hosotani | B23K 20/02 228/44.3 |
| 2009/0291524 A1* | 11/2009 | Takahashi | H01L 25/50 438/108 |
| 2012/0045869 A1* | 2/2012 | Gaynes | H01L 24/81 228/123.1 |
| 2012/0222808 A1* | 9/2012 | Hamazaki | H01L 24/75 156/583.1 |

* cited by examiner

BONDING HEAD INCLUDING A THERMAL COMPENSATOR, DIE BONDING APPARATUS INCLUDING THE SAME AND METHOD OF MANUFACTURING SEMICONDUCTOR PACKAGE USING THE SAME

CROSS-REFERENCE TO RELATED APPLICATION

Korean Patent Application No. 10-2019-0120063, filed on Sep. 27, 2019, in the Korean intellectual Property Office, and entitled: "Bonding Head, Die Bonding Apparatus Including the Same and Method of Manufacturing Semiconductor Package Using the Same," is incorporated by reference herein in its entirety.

BACKGROUND

1. Field

Embodiments relate to a bonding head, a die bonding apparatus including the same, and a method of manufacturing a semiconductor package using the same.

2. Description of the Related Art

In a die bonding process, a bonding head may be used to pick up and bond a die (individualized through a sawing process) onto a die or a substrate such as a printed circuit board (PCB).

SUMMARY

The embodiments may be realized by providing a bonding head for a die bonding apparatus, the bonding head including a head body; a thermal pressurizer mounted on a lower surface of the head body, the thermal pressurizer being configured to hold and heat at least one die and including a heater having a first heating surface that faces a held surface of the die; and a thermal compensator at an outer region of the die, the thermal compensator extending downwardly from the lower surface of the head body and including at least one thermal compensating block having a second heating surface that emits heat from a heating source therein and that faces a side surface of the die held on the thermal pressurizer.

The embodiments may be realized by providing a bonding head for a die bonding apparatus, the bonding head including a head body; a thermal pressurizer mounted on a lower surface of the head body, the thermal pressurizer being configured to hold and heat at least one die and including a heater having a first heating surface that faces a held surface of the die; and a thermal compensator at an outer region of the die, the thermal compensator extending downwardly from the lower surface of the head body and including at least one thermal compensating block having a heat reflective surface that reflects heat from the die held on the thermal pressurizer.

The embodiments may be realized by providing a die bonding apparatus including a bonding head configured to hold and heat at least one die and bond the die on a substrate or another die; a vacuum module connected to a first vacuum line in the bonding head to provide vacuum pressure for vacuum holding the die; and a cooling module connected to a first cooling line in the bonding head to circulate a cooling fluid, wherein the bonding head includes a head body; a thermal pressurizer mounted on a lower surface of the head body, the thermal pressurizer including a heater having a first heating surface that faces a held surface of the die and a collet to hold the die; and a thermal compensator at an outer region of the die, the thermal compensator extending downwardly from the lower surface of the head body and including at least one thermal compensating block having a heat reflective surface that reflects heat from the die held on the thermal pressurizer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
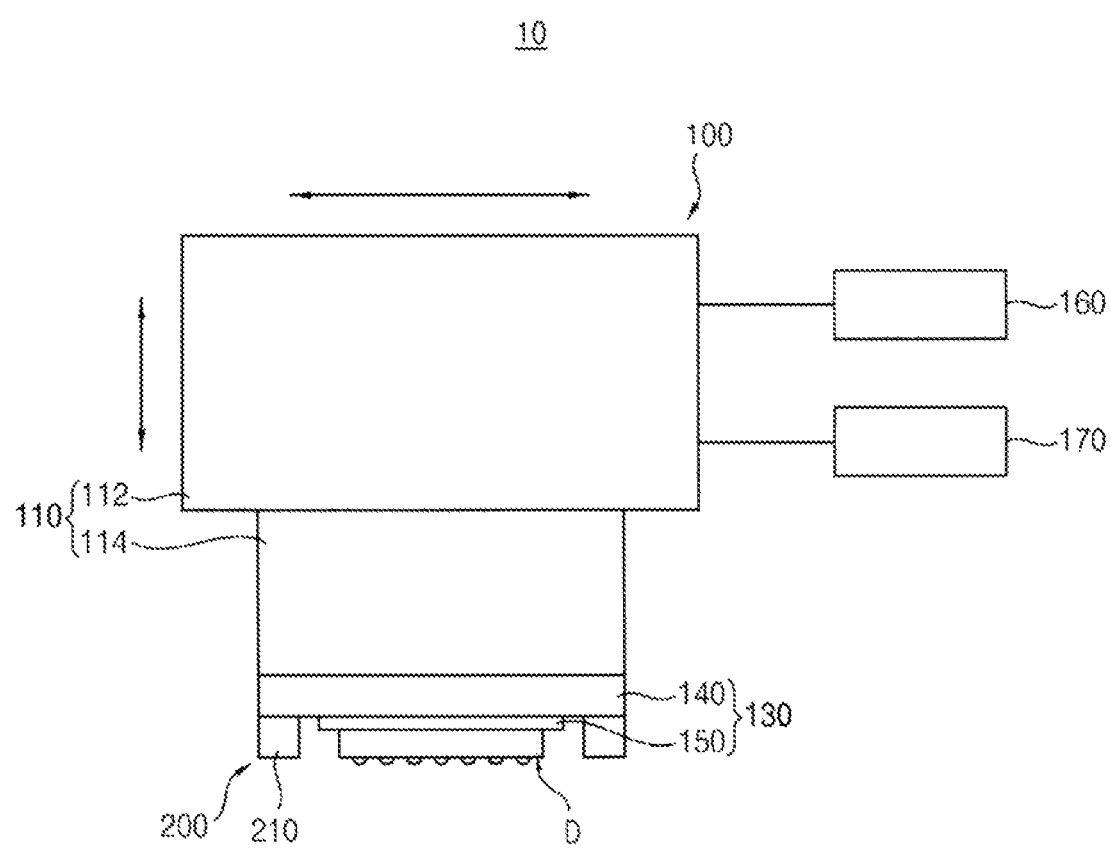
FIG. 1 illustrates a die bonding apparatus in accordance with example embodiments.
Figure 2:
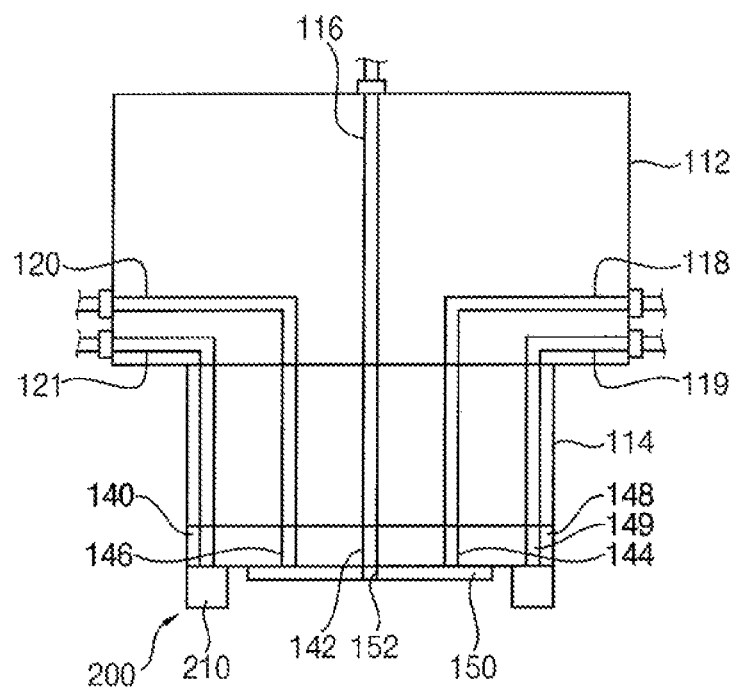
FIG. 2 illustrates a cross-sectional view of a bonding head of the die bonding apparatus of FIG. 1.
Figure 3:
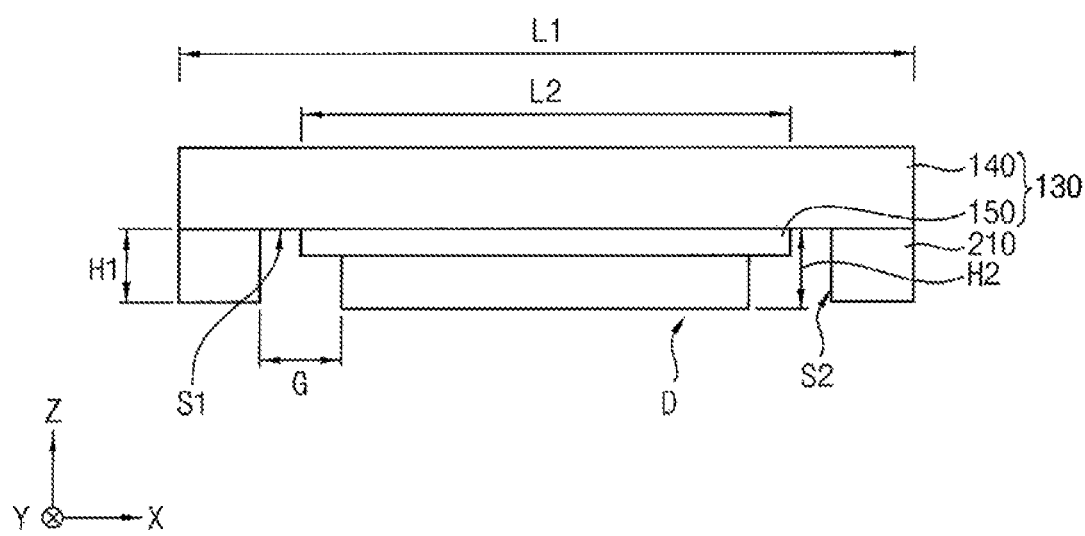
FIG. 3 illustrates a cross-sectional view of a thermal pressurizer and a thermal compensator of the bonding head of FIG. 2.
Figure 4:
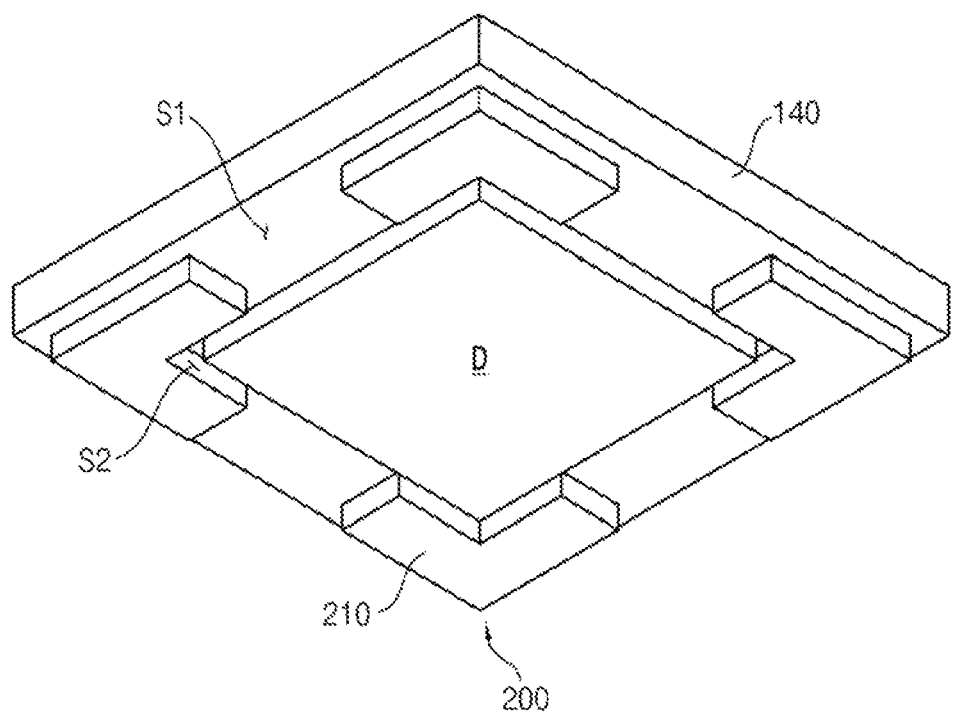
FIG. 4 illustrates a perspective view of the bonding head of FIG. 2.
Figure 5:
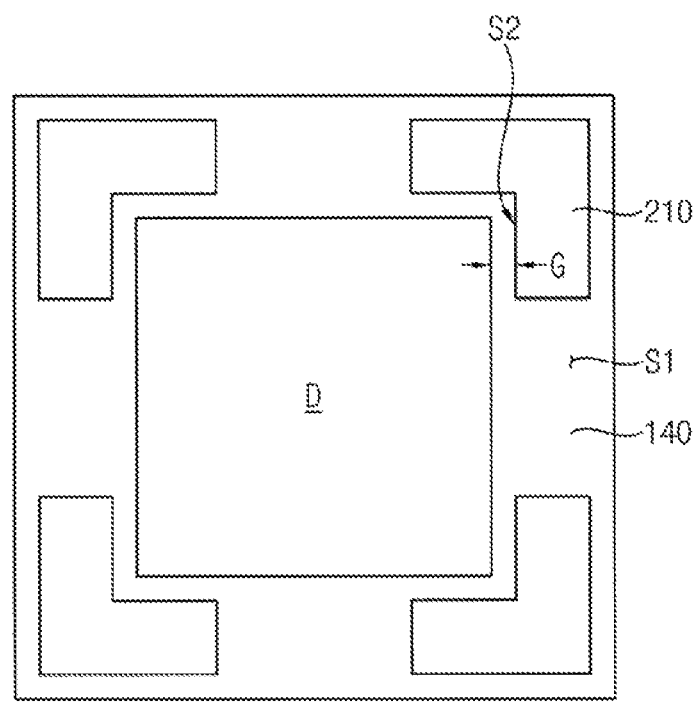
FIG. 5 illustrates a bottom view of the bonding head of FIG. 2.
Figure 6:
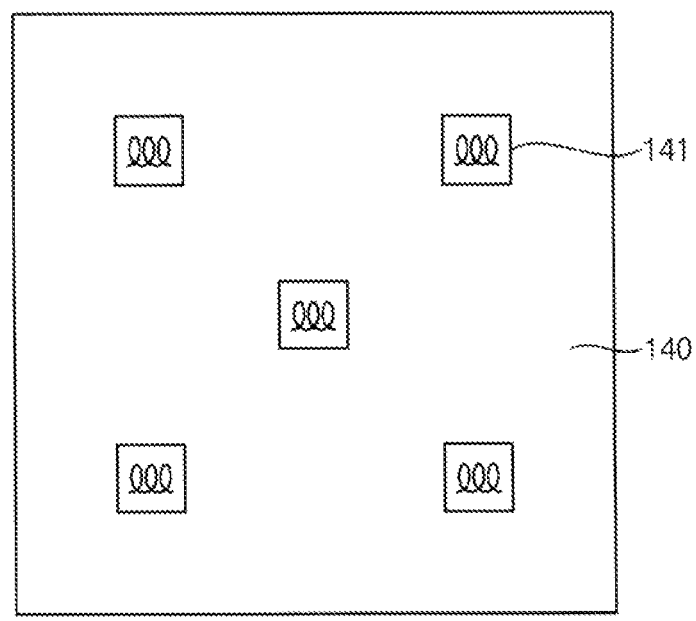
FIG. 6 illustrates a plan view of a heater of the thermal pressurizer of FIG. 3.

FIG. 1 illustrates a die bonding apparatus in accordance with example embodiments. FIG. 2 illustrates a cross-sectional view of a bonding head of the die bonding apparatus of FIG. 1. FIG. 3 illustrates a cross-sectional view of a thermal pressurizer and a thermal compensator of the bonding head of FIG. 2. FIG. 4 illustrates a perspective view of the bonding head of FIG. 2. FIG. 5 illustrates a bottom view of the bonding head of FIG. 2. FIG. 6 illustrates a plan view of a heater of the thermal pressurizer of FIG. 3.

Referring to FIGS. 1 to 6, a die bonding apparatus 10 may include a bonding head 100 and a driver to which the bonding head is attached. The bonding head 100 may include a thermal pressurizer 130 to hold (e.g., suction) and heat a die D and a thermal compensator 200 in, at, or around an outer region or side of the die D to control 3-dimensional temperature distribution of the die D. In an implementation, the die bonding apparatus 10 may further include a vacuum module 160 connected to the bonding head 100 for suctioning (e.g., providing a vacuum to) the die D and a cooling module 170 to cool the thermal pressurizer 130 and the thermal compensator 200.

In an implementation, the die bonding apparatus 10 may pick up the die D (having been individualized through a sawing process) or stacked dies D, and bond the die D onto a substrate (e.g., printed circuit board) or another die. The driver may move the bonding head 100 for suctioning the die D (or stacked dies D) and bonding the suctioned die D on the substrate (or die). In an implementation, the driver may independently move the bonding head 100 in three dimensions, e.g., in an X direction, a Y direction, and a Z direction.

The bonding head 100 may include a head body 110 attached to the driver, the thermal pressurizer 130 mounted on a lower surface of the head body 110 (e.g., a surface facing in the Z direction of FIG. 1), and the thermal compensator 200 extending downwardly from the lower surface of the head body 110.

For example, the head body 110 may include a fixing block 112 mounted on the driver and a thermal insulating block 114 mounted under the fixing block 112 (e.g., between the fixing block 112 and the thermal pressurizer 130 in the Z direction). The thermal insulating block 114 may block heat transfer from a heater 140 of the thermal pressurizer 130 to the fixing block 112. In an implementation, the thermal insulating block 114 may be mounted on the fixing block 112 using a fastener such as bolt. For example, the heater 140 may be thermally insulated from the fixing block 112 by the thermal insulating block 114.

The thermal pressurizer 130 may be mounted on the lower surface of the head body 110 to hold (e.g., by suction or vacuum) and heat at least one die D. The thermal pressurizer 130 may include the heater 140 to heat the die D and a collet 150 to hold the die D. The thermal pressurizer 130 may heat the die D and thermally pressurize or press on the substrate.

For example, the heater 140 may be attached fixedly to the lower surface of the head body 110, e.g., a lower surface of the thermal insulating member 114, using a fastener such as bolt. The heater 140 may have a first heating surface S1 facing a suctioned surface of the die D (e.g., a surface of the die held by the collet 150). The first heating surface S1 may be a plane parallel with XY plane. For example, the heater 140 may include a ceramic heater including an electrical resistance heating line.

As illustrated in FIG. 6, the heater 140 may include a plurality of heating sources 141, the temperature of each of which may be controlled independently. For example, the first heating surface S1 may be divided into regions that have different temperature ranges corresponding to the individual heating sources 141. The temperature ranges of the regions may be adjusted to control 2-dimensional temperature distribution in the first heating surface S1.

The collet 150 may serve as a bonding tool or holder that holds the die D (e.g., for picking up and transferring the die D). For example, the collet 150 may vacuum-suction or hold the die D using vacuum pressure, and may pressurize or press the die D to then be bonded on the substrate (or die).

As illustrated in FIG. 2, the heater 140 may include a through hole 142 and the collet 150 may include a through hole 152 that is continuous and connected to the through hole 142 of the heater 140. The head body 110 may include a first vacuum line 116 therein, which may be connected to the through hole 142 of the heater 140. For example, the through holes 142, 152 may be formed respectively in middle portions of the heater 140 and the collet 150, and the first vacuum line 116 may be penetrate through a middle portion of the head body 110.

The vacuum module 160 may include a vacuum pump, a valve, and the like, and may be connected to the first vacuum line 116. For example, vacuum pressure may be formed in the through hole 152 of the collet 150 to suction and hold the die D.

The collet 150 may be mounted detachably on a lower surface of the heater 140. For example, a vacuum channel for vacuum-suctioning the collet 150 may be provided in the lower surface of the heater 140, passages 144, 146 may be provided in the heater 140 to be connected to the vacuum channel, and second vacuum lines 118, 120 may be provided in the head body 110 to be connected to the passages 144, 166 respectively. The vacuum module 160 may be connected to the second vacuum lines 118, 120. For example, the collet 150 may be mounted and held on the lower surface of the heater 140 using the vacuum pressure.

In an implementation, a first cooling channel for cooling the heater 140 may be provided in the lower surface of the head body 110. The first cooling channel may be in contact with an upper surface of the heater 140 to serve as a cooler. A first cooling line may be provided in the head body 110 to be connected to the first cooling channel.

The cooling module 170 may include a cooling fluid pump, a valve, and the like, and may be connected to the first cooling line to circulate a cooling fluid. For example, the heater 140 may be cooled by the circulation of the cooling fluid.

In an implementation, the thermal compensator 200 may include at least one thermal compensating block 210 that extends downwardly (e.g., in the Z direction) in or around the outer region of the die D (held on on the thermal pressurizer 130) from the lower surface of the head body 110.

The thermal compensating block 210 may be a thermal insulation block including a thermal insulating material. The thermal compensating block 210 may have a reflective surface for reflecting heat emitting from the die D back again to the die D. The thermal compensating block 210 may serve as a thermal shield surrounding the die D. The thermal compensating block 210 may include a heating source therein, and the reflective surface may be provided as a second heating surface S2 facing a side surface of the die D. The heating source may include an electrical resistance heating line. In an implementation, the heating source may include an active heating source such as thermoelectric device.

As illustrated in FIG. 3, the thermal compensating block 210 may extend downwardly from the lower surface of the heater 140 at or near outer edges of the die D. The second heating surface S2 of the thermal compensating block 210 may be perpendicular to the first heating surface S1 of the heater 140. The second heating surface S2 may be perpendicular to XY plane.

The thermal compensating block 210 may be mounted detachably on the lower surface of the heater 140. In an implementation, the thermal compensating block 20 may be mounted on the heater 140 using a fastener such as bolt.

The thermal pressurizer 130 may have an area corresponding to an area of the die D. For example, a first side of the heater 140 may have a first length L1 (e.g., in the X direction), and a first side of the collet 150 may have a second length L2 (e.g., in the X direction). In an implementation, the first length L1 may be, e.g., 20 mm to 50 mm, and the second length L2 may be, e.g., 5 mm to 15 mm. In an implementation, a width of the thermal compensating block 210 (e.g., in the X direction) may be, e.g., 5 mm to 20 mm.

The thermal compensating block 210 may be spaced apart from the side surface of the die D (e.g., in the X direction and/or Y direction) by a predetermined distance. In an implementation, a spacing G between the second heating surface S2 of the thermal compensating block 210 and the side surface of the die D may be, e.g., 10 mm or less. Maintaining the spacing G between the second heating surface S2 of the thermal compensating block 210 and the side surface of the die D at 10 mm or less may help ensure that a performance of preventing heat emitting from the die D is not deteriorated, thereby facilitating a uniform adhesion property of a nonconductive film.

In an implementation, the thermal compensating block 210 may have a height H1 (e.g., a distance) from the lower surface of the head body 110 (in the Z direction) that is less than a height H2 (e.g., distance) of the die D from the lower surface of the head body 110 (in the Z direction). The height H1 of the thermal compensating block 210 may be at least half of the height H2 of the die D. For example, the thermal compensating block 210 may cover or be aligned with at least a portion of the side surface of the die D. In case that a plurality of the dies D is held on the thermal pressurizer 130, the height H1 of the thermal compensating block 210 may be at least half of the total height of the dies D.

As illustrated in FIGS. 4 and 5, a plurality of the thermal compensating blocks 210 may be arranged (e.g., discontinuously) along a circumference of the die D around outer edges of the die D. For example, four thermal compensating blocks 210 may be aligned with, e.g., arranged around or surrounding, four corner portions of the die D. The second heating surface S2 of the thermal compensating block 210 may face a side surface of the die D at the corner portion of the die D to heat the corner portion of the die D (e.g., which may otherwise have a relatively low temperature), to thereby provide uniform temperature distribution of the die D.

For example, a temperature difference between the middle portion and the corner portion of the die D may be decreased. For example, an unfilled phenomenon of an adhesive film that could otherwise occur due to a relatively low temperature localized at the corner portion of the die D may be prevented.

In an implementation, a second cooling channel for cooling the thermal compensating block 210 may be provided in the lower surface of the heater 140. As illustrated in FIG. 2, a cooling line 149 may be provided in the heater 140 to be connected to the second cooling channel, and second cooling lines 119, 121 may be provided in the head body 110 to be connected to the cooling lines 149 of the heater 140. The cooling module 170 may be connected to the second cooling lines 119, 121. For example, the thermal compensating block 210 may be cooled by the circulation of the cooling fluid.

As mentioned above, the bonding head 100 of the die bonding apparatus 10 may include the thermal pressurizer 130 configured to hold and heat at least one die D and including the heater 140 having the first heating surface S1 facing the suctioned surface of the die D and the thermal compensator 200 at outer edges of the die D and including at least one thermal compensating block 210 having the second heating surface S2 facing the side surface of the die D held on the thermal pressurizer 130. For example, the thermal compensator 200 may be a thermal shield that reflects heat emitting from the die D back again to the die D.

The heater 140 may help control the 2-dimensional temperature distribution in the first heating surface S1, and the thermal compensator 200 may help control the 3-dimensional temperature distribution of the die D through the second heating surface S2. For example, the thermal compensator 200 may help control a temperature distribution in a thickness, e.g., X direction (or stacking direction) of the die (or a plurality of the stacked dies).

For example, heat flux transferred from the bonding head 100 to the die D and the adhesive film may be controlled to have a desired 3-dimensional temperature distribution, so that uniform physical properties of the adhesive film may be secured to thereby help reduce or prevent poor adhesion.

FIGS. 7 to 10 illustrate plan views of various arrangements of the thermal compensating blocks.

Figure 7:
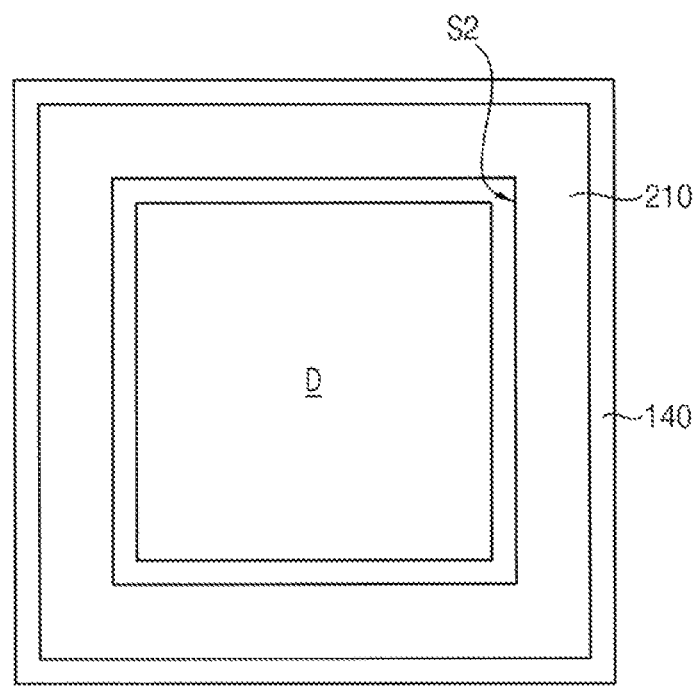
FIGS. 7 to 10 illustrate plan views of various arrangements of the thermal compensating blocks.
Figure 8:
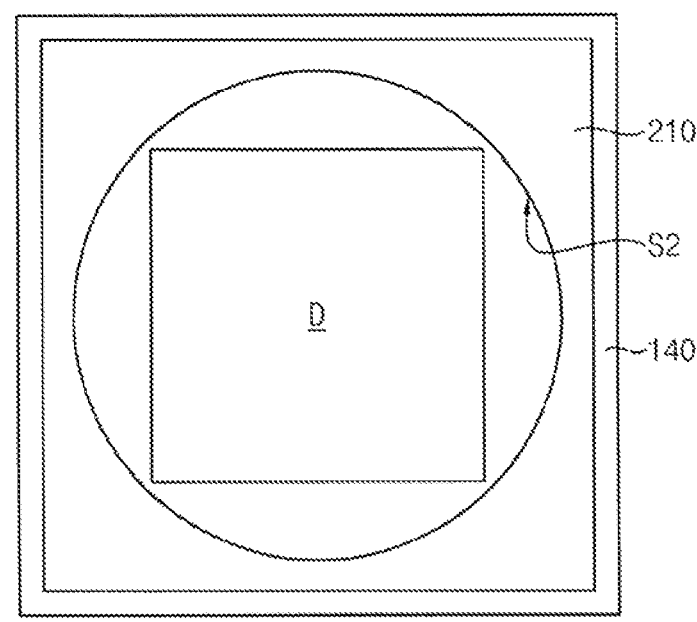

Referring to FIGS. 7 and 8, one thermal compensating block 210 may extend to (e.g., continuously) surround a die D held on a lower surface of a heater 140. The whole side surface (e.g., all side surfaces) of the die D may be surrounded by the thermal compensating block 210. The thermal compensating block 210 may completely surround the die D, to serve as a thermal shield. A thermal blocking space may be between an inner reflective surface of the thermal compensating block 210 and the side surface of the die D.

As illustrated in FIG. 7, the reflective surface of the thermal compensating block 210 may have a rectangular shape (e.g., may extend around the die D in a rectangular shape). As illustrated in FIG. 8, the reflective surface of the thermal compensating block 210 may have a circular shape (e.g., may extend around the die D in a circular shape). The second heating surface S2 of the thermal compensating block 210 may be provided in portions of the reflective surface. For example, the second heating surface S2 of the thermal compensating block 210 may be provided to cover or adjacent to a corner portion of the die D.

Figure 9:
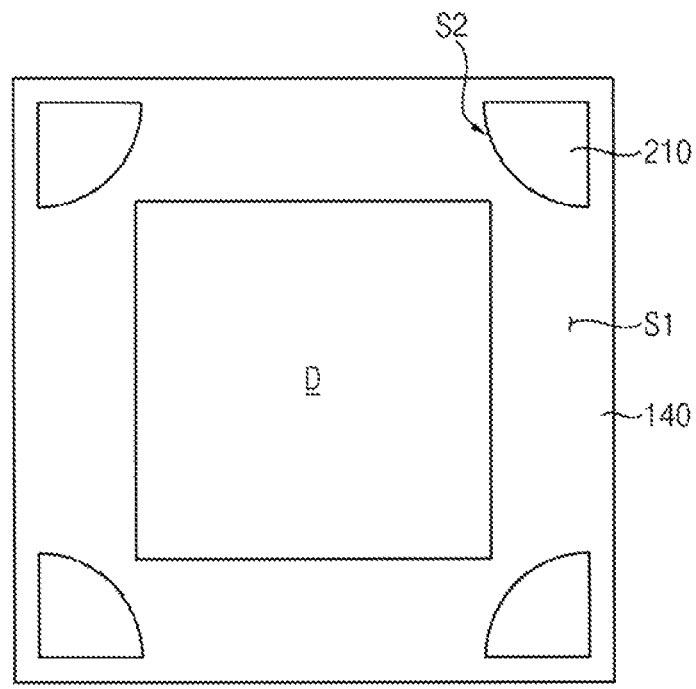

Referring to FIG. 9, four thermal compensating blocks 210 may be arranged to cover, face, or otherwise be aligned with corner portions of a die D held on a lower surface of the heater 140 respectively. A second heating surface S2 of the thermal compensating block 210 may have a fan shape (e.g., a convex shape protruding toward the corners of the die D). The thermal compensating block 210 may be arranged such that a middle region of the second heating surface S2 is nearest to the corresponding corner of the die D.

Figure 10:
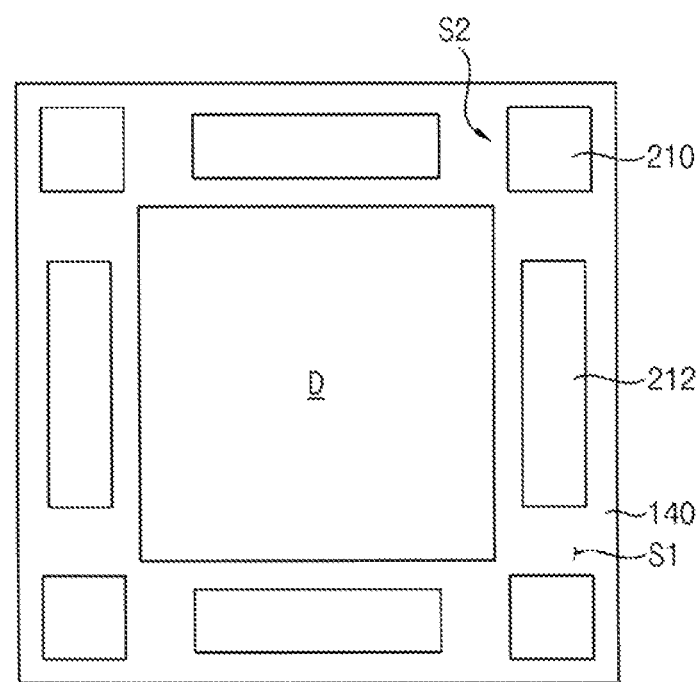

Referring to FIG. 10, a thermal compensator may include four thermal compensating blocks 210 covering, aligned with, or facing corners of a die D and four auxiliary thermal compensating blocks 212 covering, aligned with, or facing side portions or sides of the die D. The auxiliary thermal compensating blocks 212 may extend lengthwise along the side portion of the die D.

A second heating surface S2 of the thermal compensating block 210 may be heated to a first temperature, and a second heating surface S2 of the auxiliary thermal compensating block 212 may be heated to a second temperature different from the first temperature. For example, the first temperature may be higher than the second temperature.

The number, arrangements, etc. of the thermal compensating blocks and the auxiliary thermal compensating blocks may be adjusted as desired.

Figure 11:
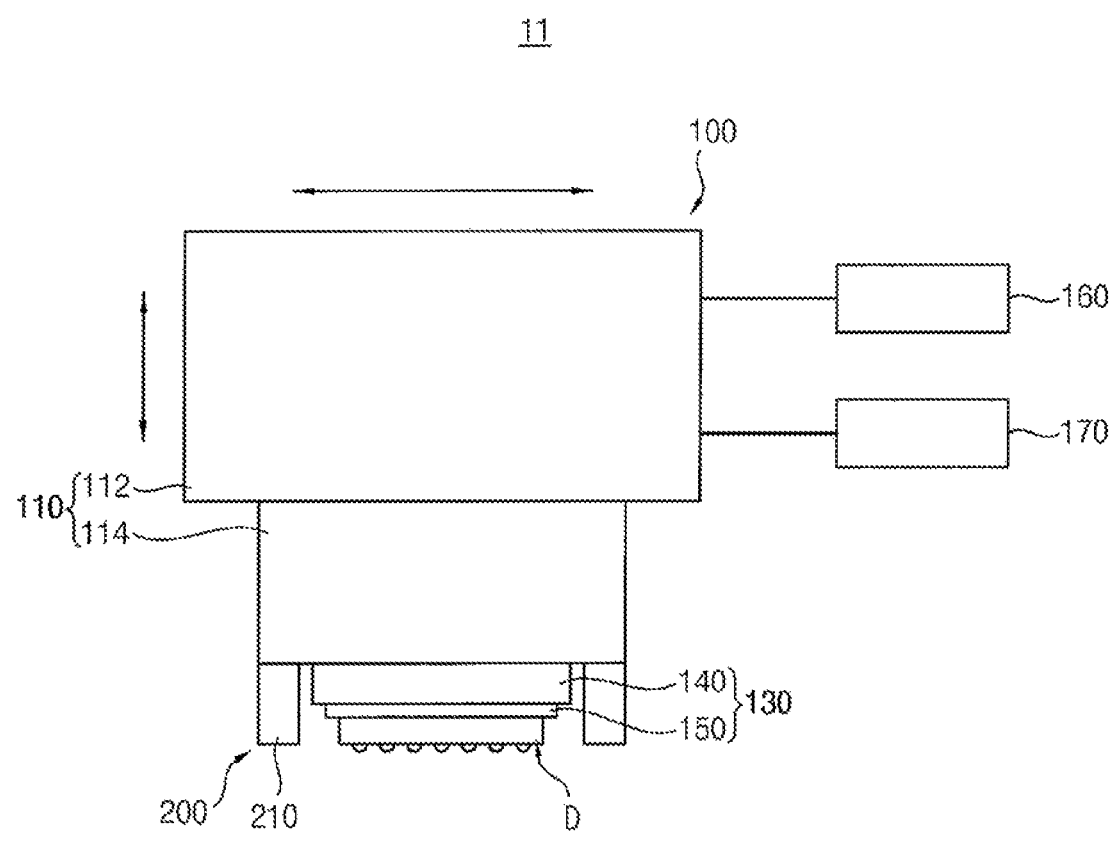
FIG. 11 illustrates a die bonding apparatus in accordance with example embodiments.
Figure 12:
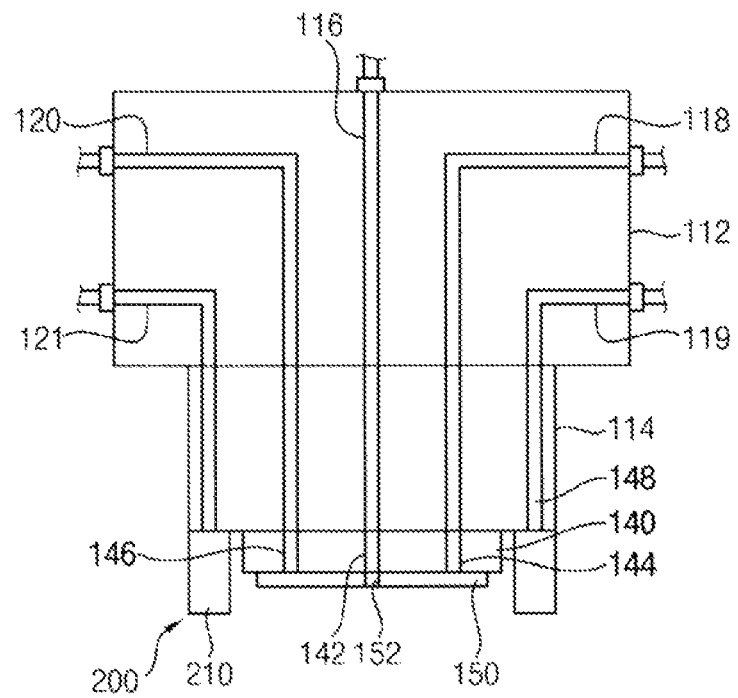
FIG. 12 illustrates a cross-sectional view of a bonding head of the die bonding apparatus of FIG. 11.
Figure 13:
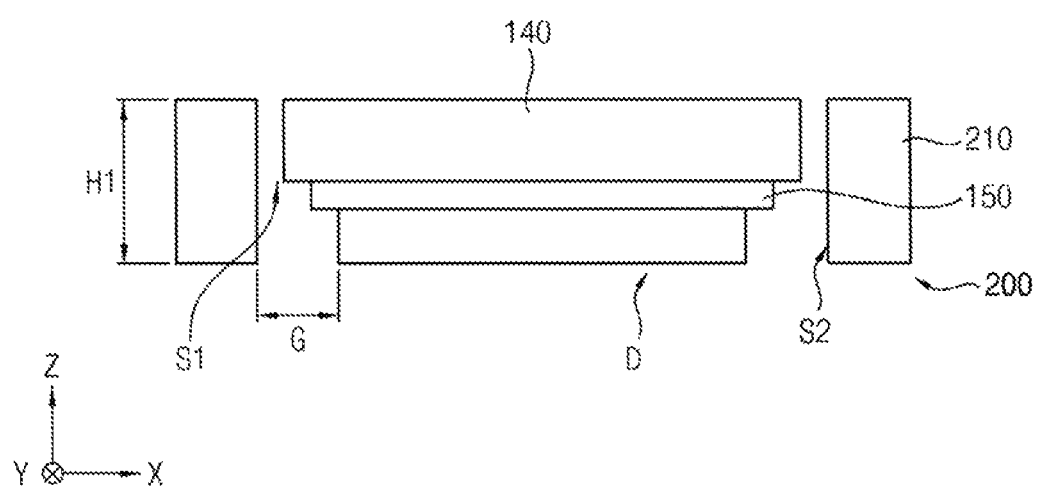
FIG. 13 illustrates a cross-sectional view of a thermal pressurizer and a thermal compensator of the bonding head of FIG. 12.

FIG. 11 illustrates a die bonding apparatus in accordance with example embodiments. FIG. 12 illustrates a cross-sectional view of a bonding head of the die bonding apparatus of FIG. 11. FIG. 13 illustrates a cross-sectional view of a thermal pressurizer and a thermal compensator of the bonding head of FIG. 12. The die bonding apparatus may be substantially the same as or similar to the die bonding apparatus described with reference to FIG. 1 except for a configuration of the thermal compensator. For example, same reference numerals will be used to refer to the same or like elements and repeated explanations concerning the above elements may be omitted.

Referring to FIGS. 11 to 13, a thermal compensating block 210 of a thermal compensator 200 of a die bonding apparatus 11 may extend downwardly (in the Z direction) in, at, or around an outer region of a die D from a lower surface of a head body 110. The thermal compensating block 210 may be mounted detachably on the lower surface of the head body 110. In an implementation, the thermal compensating block 210 may be mounted on the head body 110 using a fastener such as bolt. The thermal compensating block 210 may be spaced apart (in the X direction and/or Y direction) from a thermal pressurizer 130. The thermal compensating block 210 may be spaced apart (in the X direction and/or Y direction) from a side surface of the die D by a predetermined distance.

In an implementation, a second cooling channel for cooling the thermal compensating block 210 may be provided in a lower surface of a thermal insulating block 114 of the head body 110. As illustrated in FIG. 12, a cooling line 148 may be provided in the thermal insulating block 114 of the head body 110 to be connected to the second cooling channel, and second cooling lines 119, 121 may be provided in a fixing block 112 of the head body 110 to be connected to the cooling lines 148. A cooling module 170 may be connected to the second cooling lines 119, 121. For example, the thermal compensating block 210 may be cooled by a circulation of a cooling fluid.

Figure 14A:
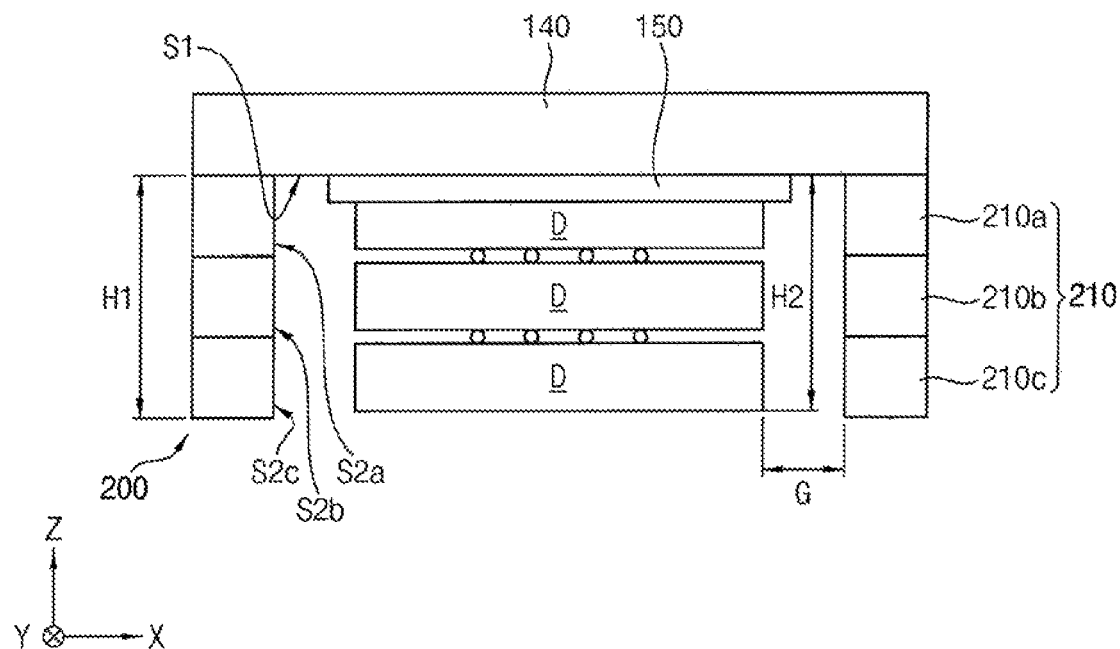
FIGS. 14A and 14B illustrate cross-sectional views of a thermal pressurizer and a thermal compensator of a die bonding apparatus in accordance with example embodiments.
Figure 14B:
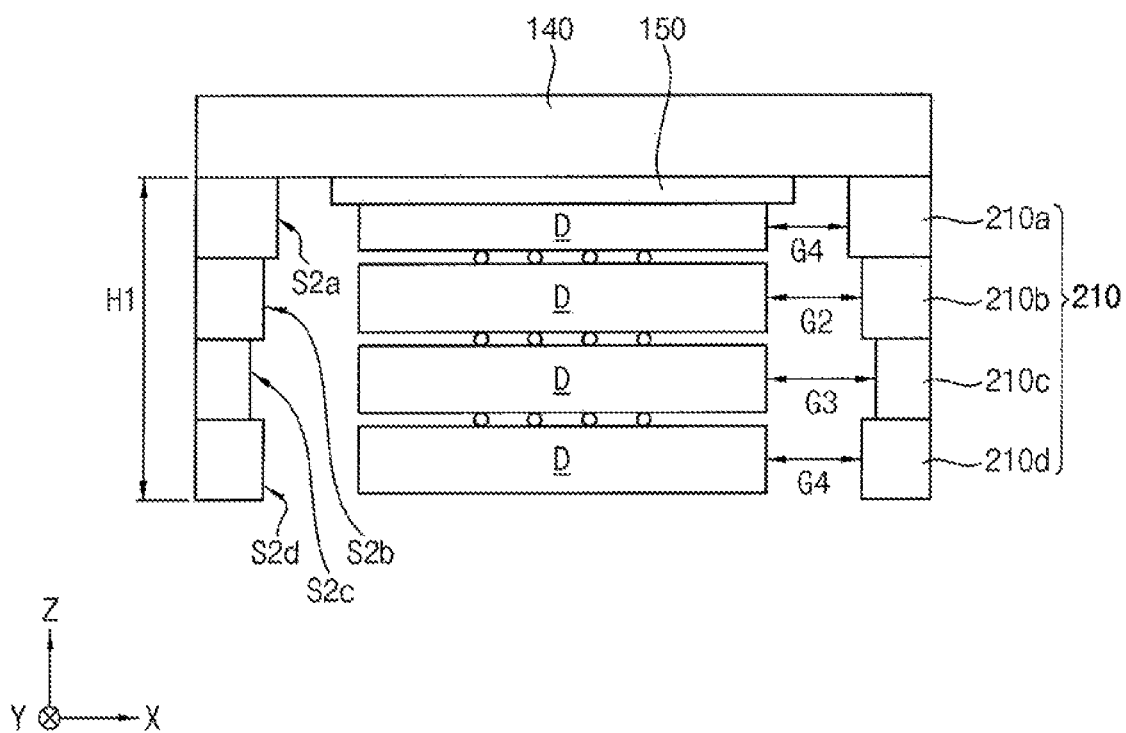
Figure 15:
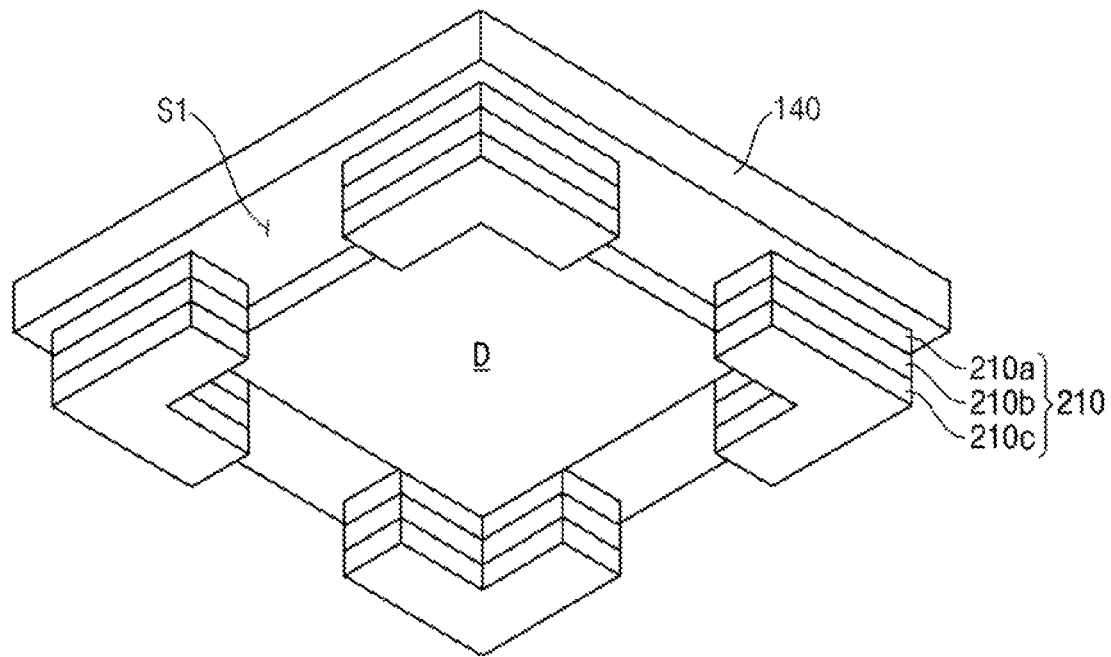
FIG. 15 illustrates a perspective view of the thermal pressurizer and the thermal compensator of FIG. 14A.

FIGS. 14A and 14B illustrate cross-sectional views of a thermal pressurizer and a thermal compensator of a die bonding apparatus in accordance with example embodiments. FIG. 15 illustrates a perspective view of the thermal pressurizer and the thermal compensator of FIG. 14A. The die bonding apparatus may be substantially the same as or similar to the die bonding apparatus described with reference to FIG. 1 except for a configuration of the thermal compensator. Thus, same reference numerals will be used to refer to the same or like elements and repeated explanation concerning the above elements may be omitted.

Referring to FIGS. 14A, 14B and 15, a thermal pressurizer 130 of a die bonding apparatus may hold and heat stacked dies D, and a thermal compensator 200 may be provided in, at, or around an outer region of the stacked dies D and may include a thermal compensating block 210 for controlling 3-dimensional temperature distribution of the dies D.

In an implementation, as illustrated in FIG. 14A, the thermal compensating block 210 may include a plurality of stacked blocks 210a, 210b, 210c. The blocks 210a, 210b, 210c may be sequentially stacked in or around the outer region of the dies D to surround at least the corner portions of the dies D. In an implementation, the blocks 210a, 210b, 210c may surround the die D, to serve as a thermal shielding member or thermal shield. The blocks may be assembled detachably to each other. In an implementation, some of the blocks may be assembled to be stacked in or around the outer region of the die D.

The blocks 210a, 210b, 210c may have reflective (e.g., heat reflective) surfaces S2a, S2b, S2c facing side surfaces of the dies D respectively. A thermal blocking space may be between the inner reflective surfaces S2a, S2b, S2c of the blocks 210a, 210b, 210c and the side surfaces of the dies D. Each of the blocks 210a, 210b, 210c may include a heating source therein, and the reflective surfaces S2a, S2b, S2c may be a second heating surface S2 facing the side surface of the die D.

Some of the blocks 210a, 210b, 210c may be assembled according to a height of the stacked dies D (in the Z direction). The blocks 210a, 210b, 210c may be stacked in a stacking direction of the dies D to facilitate 3-dimensional temperature distribution.

In an implementation, as illustrated in FIG. 14B, the thermal compensating block 210 may include a plurality of stacked first to fourth blocks 210a, 210b, 210c, 210d. The first to fourth blocks 210a, 210b, 210c, 210d may have spacing distances GI, G2, G3, G4 from the side surface of the die D respectively (in the X direction and/or Y direction), and at least one of the spacing distances G1, G2, G3, G4 may be different from at least one other one of the spacing distances GI, G2, G3, G4. In an implementation, the first spacing distance G1 between a reflective surface of the first block 210a and the side surface of the die D may be 1 mm, the second spacing distance G2 between a reflective surface of the second block 210b and the side surface of the die D may be 2 mm, the third spacing distance G3 between a reflective surface of the third block 210c and the side surface of the die D may be 3 mm, and the fourth spacing distance G4 between a reflective surface of the fourth block 210d and the side surface of the die D may be 2 mm.

Figure 16:
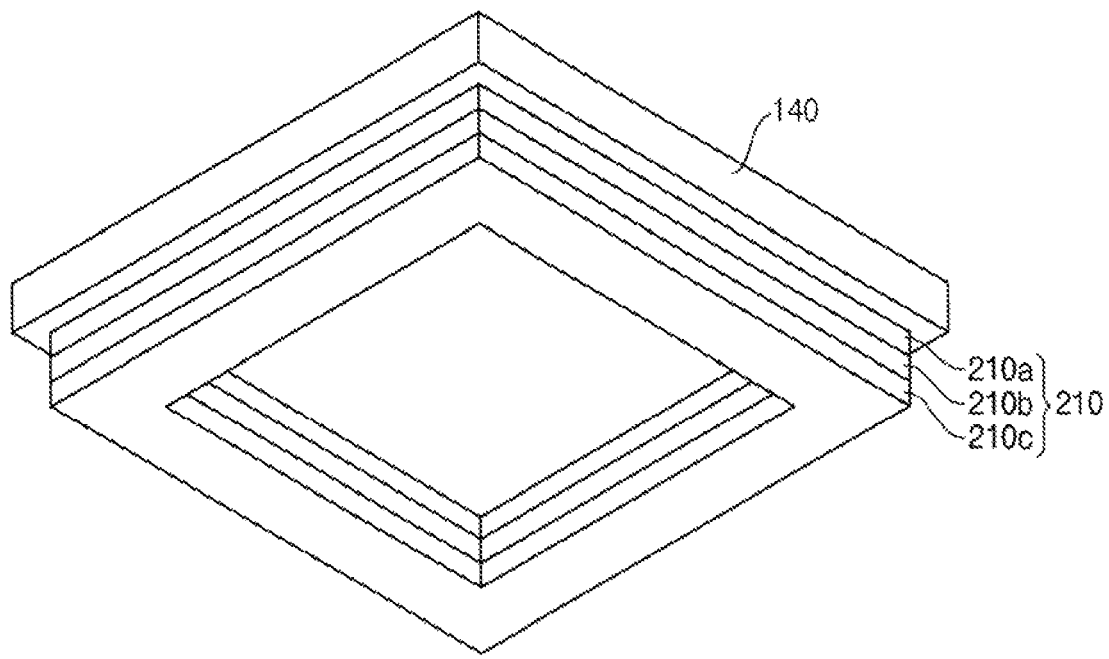
FIG. 16 illustrates a perspective view of a modified configuration of the thermal compensating block of FIG. 15.

FIG. 16 illustrates a perspective view of a modified configuration of the thermal compensating block of FIG. 15.

Referring to FIG. 16, a plurality of stacked blocks 210a, 210b, 210c of the thermal compensating block 210 may extend to surround (e.g., completely and continuously surround) the die D held on a lower surface of a heater 140, respectively. The whole side surface of the stacked died D may be surrounded by the blocks 210a, 210b, 210c. The thermal compensating block 210 may completely surround the stacked die D, to serve as a thermal shield. A thermal blocking space may be between inner reflective surfaces of the blocks 210a, 210b, 210c and the side surfaces of the dies D.

Hereinafter, a method of manufacturing a semiconductor package using the die bonding apparatus will be explained.

FIGS. 17 to 21 illustrate stages in a method of manufacturing a semiconductor package in accordance with example embodiments.

Referring to FIGS. 17 to 21, a first semiconductor device 400 may be stacked on a package substrate 510, and then, a second semiconductor device 300a, 300b may be stacked on the first semiconductor device 400 to form a semiconductor package 500.

Figure 17:
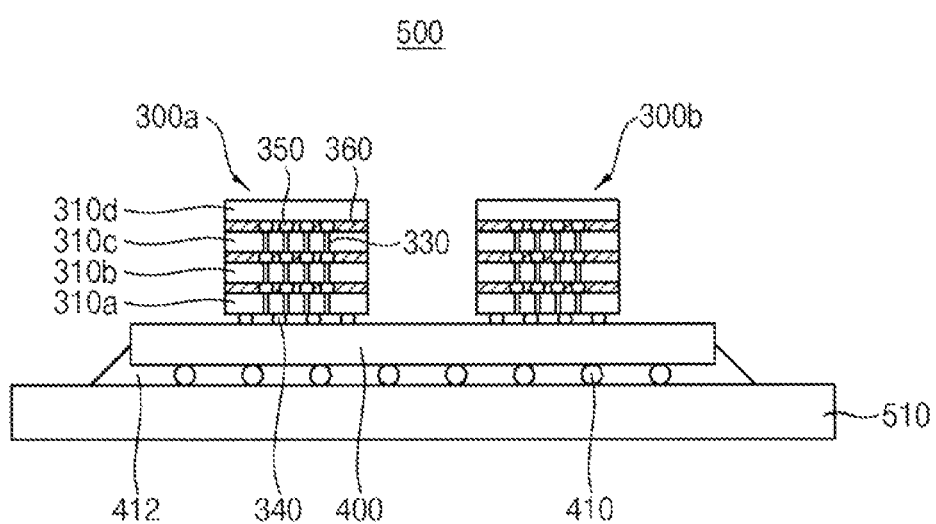
FIGS. 17 to 21 illustrate views of stages in a method of manufacturing a semiconductor package in accordance with example embodiments.

Referring to FIG. 17, first, the first semiconductor device 400 may be stacked on an upper surface of the package substrate 510. The package substrate 510 may include a printed circuit board (PCB), a glass substrate, a ceramic substrate, a module board, or the like.

The first semiconductor device 400 may be mounted on the package substrate 510 by a flip chip bonding process. The first semiconductor device 400 may be electrically connected to the package substrate 510 via conductive bumps 410. A plurality of the conductive bumps 410 may be disposed on a plurality of substrate pads on the upper surface of the package substrate 510 such that the first semiconductor device 410 may be joined on the package substrate 510.

After the first semiconductor device 400 is joined on the package substrate 510, an adhesive material 412 may be under-filled between the first semiconductor device 400 and the package substrate 510. The adhesive material may include an epoxy material to reinforce a gap between the first semiconductor device 400 and the package substrate 510.

Then, two second semiconductor devices 300a, 300b may be stacked on the first semiconductor device 400. The second semiconductor device 300a, 300b may include a buffer die 310a and first to third memory dies 310b, 310c, 310d sequentially stacked on the buffer die 310a. The buffer die 310a and the first to third memory dies 310b, 310c, 310d may communicate date signals and control signals with each other through TSVs (through silicon vias) 330. The buffer die 310a may be electrically connected to the first semiconductor device 400 by a plurality of conductive bumps 340. In an implementation, the semiconductor package may include four stacked dies (chips) as HBM (High Bandwidth Memory) device.

In an implementation, the buffer die 310a and the first to third memory dies 310b, 310c, 310d may be bonded using the die bonding apparatus according to an embodiment (e.g., as illustrated in FIG. 1 or FIG. 11).

Figure 18:
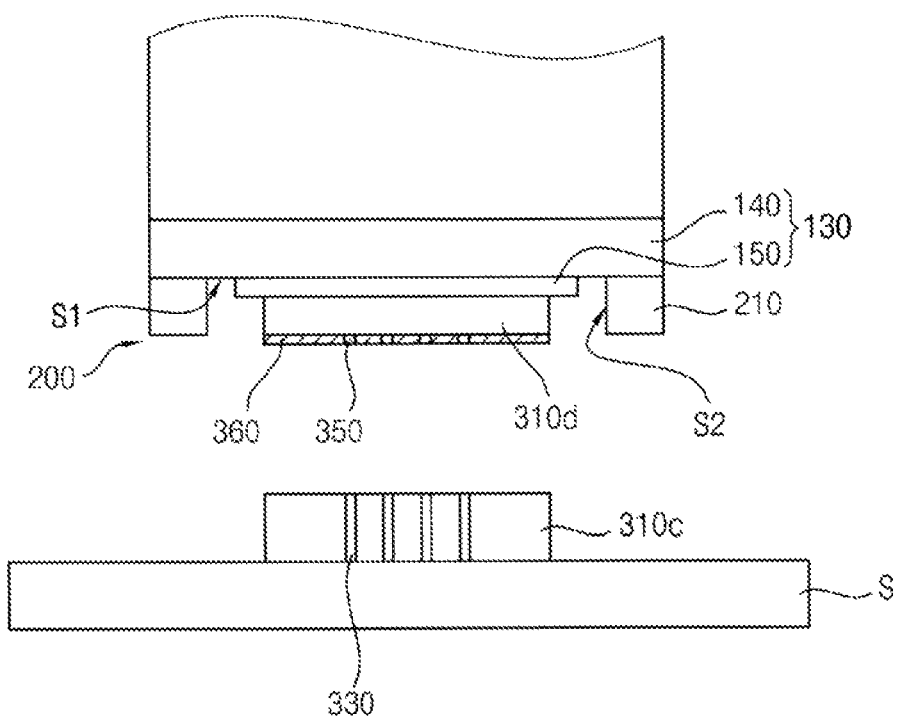
Figure 19:
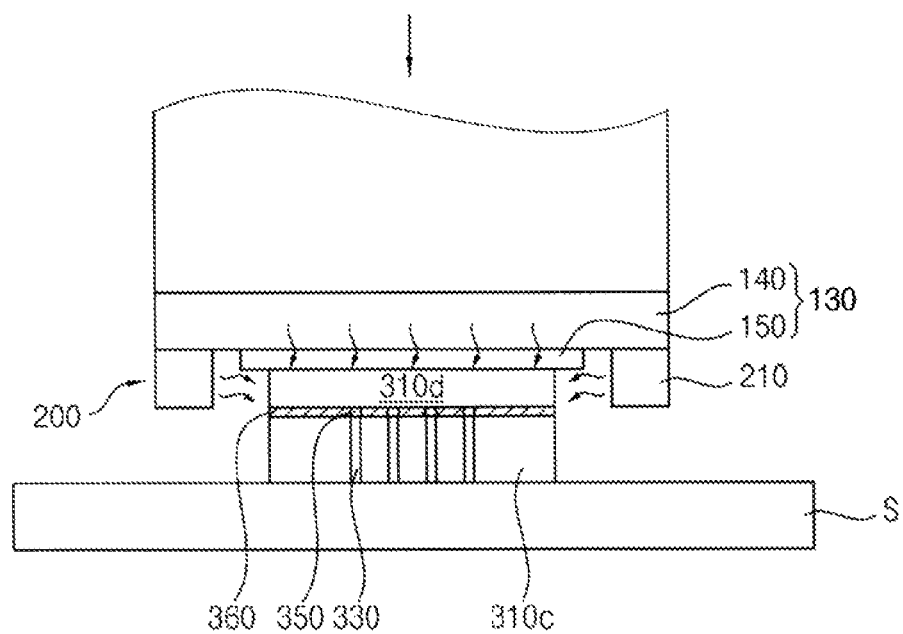

Referring to FIGS. 18 and 19, a bonding head of a die bonding apparatus may suction and hold the third memory die 310d individualized through a sawing process and place the third memory die 310d on the second memory die 310c on a stage S. Then, a thermal pressurizer 130 of the bonding head may heat and thermally pressurize or press the third memory die 310d.

Bumps 350 may be formed on bonding pads of the third memory die 310d, and an adhesive film 360 (such as nonconductive adhesive film (NCF)) may be coated on a bonded surface of the third memory die 310d. In an implementation, the adhesive film may be coated on a bonded surface of the second memory die 310c.

The thermal pressurizer 130 of the bonding head may heat the third memory die 310d such that the bumps may be reflowed to form conductive bumps between the third memory die 310d and the second memory die 310c. Additionally, the third memory die 310d may be bonded on the second memory die 310c by the adhesive film 360.

For example, the thermal compensator 200 of the bonding head may help control heat flux transferred to the third memory die 310d and the adhesive film 360 to have a desired 3-dimensional temperature distribution. A thermal compensating block 210 of the thermal compensator 200 may serve as a thermal shield for reflecting heat emitted from a side surface (corner portion) of the third memory die 310d back again to the die. Additionally, the thermal compensating block 210 may have a second heating surface S2 that emits heat from a heating source therein and may heat the corner portion of the third memory die 310d having a relatively lower temperature to thereby provide uniform temperature distribution of the third memory die 310d.

For example, a temperature difference between a middle portion and the corner portion of the third memory die 310d may be decreased. For example, an unfilled phenomenon of the adhesive film, which could otherwise occur due to a relatively lower temperature of the corner portion of the third memory die 310d, may be prevented.

Then, processes the same as or similar to the processes described with reference to FIGS. 18 and 19 may be performed to bond the stacked third and second memory dies 310d, 310c on the first memory die 310b and to bond the stacked third to first memory dies 310d, 310c, 310b on the buffer die 310a.

Figure 20:
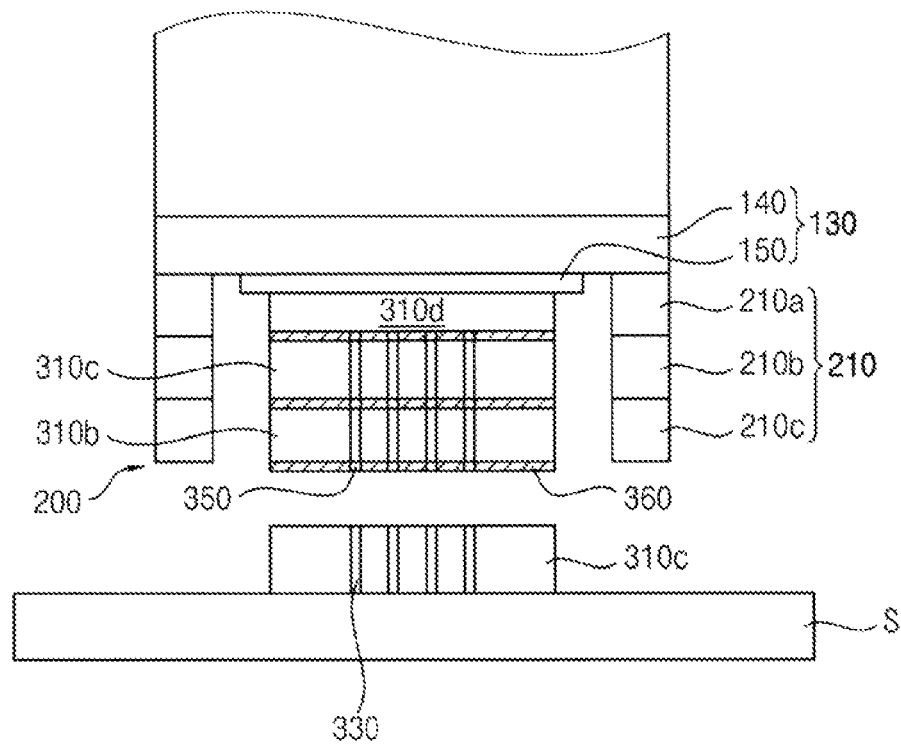
Figure 21:
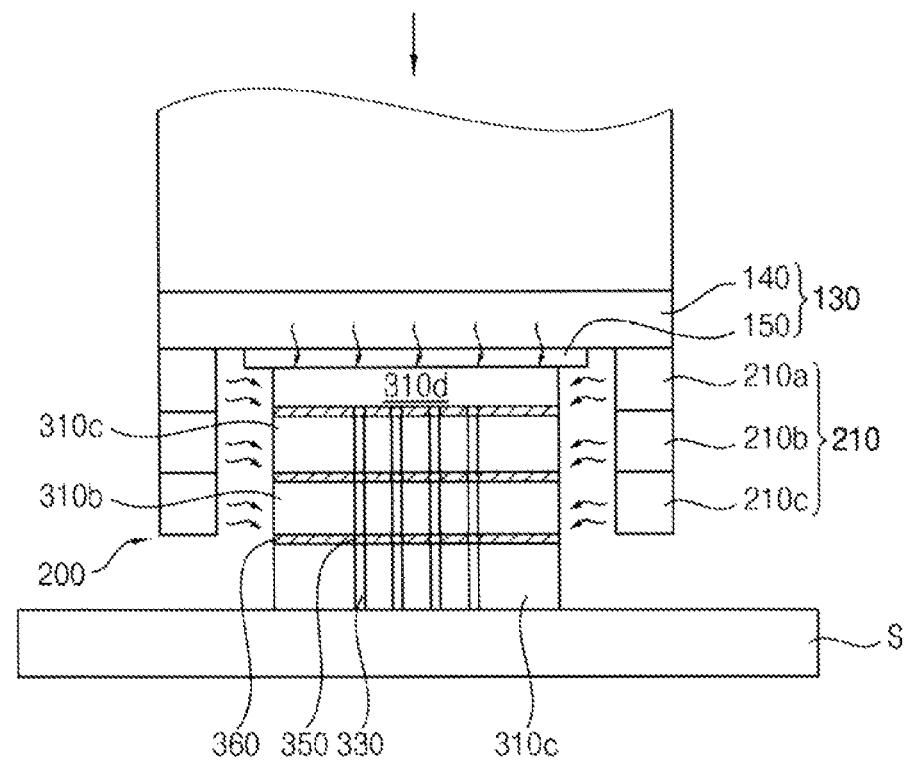

Referring to FIGS. 20 and 21, the bonding head of the die bonding apparatus may suction and hold the stacked third to first memory dies 310d, 310c, 310b and place them on the buffer die 310a on the stage S. Then, the thermal pressurizer 130 of the bonding head may heat and thermally press the third to first memory dies 310d, 310c, 310b.

For example, the thermal compensating block 210 of the thermal compensator 200 may include three blocks 210a, 210b, 210c assembled according to a height of the stacked memory dies 310d, 310c, 310b. Each of the blocks 210a, 210b, 210c may include a heating source therein, and the blocks 210a, 210b, 210c may be stacked in a stacking direction of the dies to facilitate 3-dimensional temperature distribution.

For example, the thermal compensator 200 of the bonding head may help control heat flux, which is transferred to the third to first memory dies 310d, 310c, 310b and the adhesive film 360 to have a desired 3-dimensional temperature distribution. For example, an unfilled phenomenon of the adhesive film, which could otherwise occur due to a relatively lower temperature distribution, may be prevented.

A semiconductor package in accordance with example embodiments may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like. The semiconductor package may be applied to a personal computer PC or a portable electronic device such as a notebook, a cell phone, a personal digital assistant (PDA) and a camera.

By way of summation and review, during die bonding, when the die is heated to melt an adhesive film such as a non-conductive adhesive film, non-uniform temperature distribution of the die could occur due to in-plane temperature distribution of an existing heating head, and due to external exposure of a side surface of the die. For example, physical properties (e.g. adhesive force, viscosity coefficient, elastic modulus, thermal expansion coefficient, etc.) of the adhesive film may be changed. Due to the changes in the physical properties of the adhesive film, non-uniform shrinkage cold be induced during curing of the adhesive film, and as a result, after bonding, an unfilled phenomenon of the adhesive film and a warping phenomenon of the bonded die could occur.

According to example embodiments, a bonding head of a die bonding apparatus may include a thermal pressurizer configured to suction and heat at least one die and including a heater having a first heating surface which faces a suctioned surface of the die, and a thermal compensator provided in an outer region of the die and including at least one thermal compensating block having a second heating surface which faces a side surface of the die suctioned on the thermal pressurizer. The thermal compensator may serve as a thermal shield that reflects heat emitting from the die again to the die and a heating mechanism which heat actively the side surface of the die.

The heater may control 2-dimensional temperature distribution in the first heating surface firstly, and the thermal compensator may additionally control the 2-dimensional temperature distribution in the first heating surface by heat transferred through the second heating surface secondly, and may further control 3-dimensional temperature distribution of the die. For example, the thermal compensator may control temperature distribution in through plane direction and in a thickness direction of the die (a plurality of stacked dies).

For example, heat flux transferred from the bonding head to the die and an adhesive film may be controlled to have a desired 3-dimensional temperature distribution, so that physical properties of the adhesive film may be secured uniformly to thereby help prevent adhesion failure and prevent (or reduce) warpage of the die after bonding.

One or more embodiments may provide a bonding head configured to pick up a die and bond on a substrate or a die.

One or more embodiments may provide a bonding head of a die bonding apparatus which is capable of providing uniform temperature distribution in a die during a die bonding process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A bonding head for a die bonding apparatus, the bonding head comprising:
    a head body;
    a thermal pressurizer mounted on a lower surface of the head body, the thermal pressurizer being configured to hold and heat at least one die and including a heater having a first heating surface that faces a held surface of the die; and
    a thermal compensator at an outer region of the die, the thermal compensator extending downwardly from the lower surface of the head body and including at least one thermal compensating block having a second heating surface that emits heat from a heating source therein and that faces a side surface of the die held on the thermal pressurizer.

2. The bonding head for a die bonding apparatus as claimed in claim 1, wherein the thermal compensating block extends to surround a corner portion of the die.

3. The bonding head for a die bonding apparatus as claimed in claim 1, wherein the thermal compensating block extends to completely surround the die.

4. The bonding head for a die bonding apparatus as claimed in claim 1, wherein the thermal compensating block includes a thermal insulating material.

5. The bonding head for a die bonding apparatus as claimed in claim 1, wherein a spacing distance between the second heating surface and the side surface of the die is 10 mm or less.

6. The bonding head for a die bonding apparatus as claimed in claim 1, wherein the thermal compensating block has a height from the lower surface of the head body that is less than a height of the die from the lower surface of the head body.

7. The bonding head for a die bonding apparatus as claimed in claim 1, wherein the thermal compensating block includes a plurality of stacked blocks.

8. The bonding head for a die bonding apparatus as claimed in claim 7, wherein at least one stacked block of the plurality of stacked blocks has a spacing distance from the side surface of the die that is different from a spacing distance from the side surface of the die to at least one other stacked block of the plurality of stacked blocks.

9. The bonding head for a die bonding apparatus as claimed in claim 1, wherein the second heating surface is perpendicular to the first heating surface.

10. The bonding head for a die bonding apparatus as claimed in claim 1, wherein the heater includes a plurality of heating sources, a temperature of each heating source of the plurality of heating sources being controlled independently.

11. A bonding head for a die bonding apparatus, the bonding head comprising:
    a head body;
    a thermal pressurizer mounted on a lower surface of the head body, the thermal pressurizer being configured to hold and heat at least one die and including a heater having a first heating surface that faces a held surface of the die; and
    a thermal compensator at an outer region of the die, the thermal compensator extending downwardly from the lower surface of the head body and including at least one thermal compensating block having a heat reflective surface that reflects heat from the die held on the thermal pressurizer.

12. The bonding head for a die bonding apparatus as claimed in claim 11, wherein the thermal compensating block includes a thermal insulating material.

13. The bonding head for a die bonding apparatus as claimed in claim 11, wherein:
    the thermal compensating block includes a heating source therein, and
    the heat reflective surface is a second heating surface that faces a side surface of the die.

14. The bonding head for a die bonding apparatus as claimed in claim 11, wherein the thermal compensating block extends to surround a corner portion of the die.

15. The bonding head for a die bonding apparatus as claimed in claim 11, wherein the thermal compensating block extends to completely surround the die.

16. The bonding head for a die bonding apparatus as claimed in claim 11, wherein a spacing distance between the second heating surface and the side surface of the die is 10 mm or less.

17. The bonding head for a die bonding apparatus as claimed in claim 11, wherein the thermal compensating block has a height from the lower surface of the head body less than a height of the die from the lower surface of the head body.

18. The bonding head for a die bonding apparatus as claimed in claim 11, wherein the thermal compensating block includes a plurality of stacked blocks.

19. The bonding head for a die bonding apparatus as claimed in claim 18, wherein at least one stacked block of the plurality of stacked blocks has a spacing distance from the side surface of the die that is different from a spacing distance from the side surface of the die to at least one other stacked block of the plurality of stacked blocks.

20. The bonding head for a die bonding apparatus as claimed in claim 11, wherein the heater includes a plurality of heating sources, a temperature of each heating source of the plurality of heating sources being controlled independently.

* * * * *